(12) United States Patent
Apel

(10) Patent No.: US 7,148,748 B2
(45) Date of Patent: *Dec. 12, 2006

(54) ACTIVE PROTECTION CIRCUIT FOR LOAD MISMATCHED POWER AMPLIFIER

(75) Inventor: Thomas R. Apel, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/884,135

(22) Filed: Jul. 2, 2004

(65) Prior Publication Data

US 2004/0239428 A1    Dec. 2, 2004

Related U.S. Application Data

(63) Continuation of application No. 10/215,802, filed on Aug. 9, 2002, now Pat. No. 6,762,647.

(51) Int. Cl.
*H03G 3/10* (2006.01)

(52) U.S. Cl. ............................ 330/279; 330/285

(58) Field of Classification Search ............. 330/259, 330/260, 261, 270, 271, 273, 284, 285, 290
See application file for complete search history.

(56) References Cited

U.S. PATENT DOCUMENTS

| | | | |
|---|---|---|---|
| 3,378,781 A | 4/1968 | Hill | |
| 3,495,179 A | 2/1970 | Moss | |
| 3,541,457 A | 11/1970 | Leighty et al. | |
| 3,586,991 A | 6/1971 | Vosteen | |
| 3,611,174 A | 10/1971 | Day | |
| 4,061,983 A | 12/1977 | Suzuki | |
| 4,077,014 A | 2/1978 | Satoh | |
| 4,199,797 A | 4/1980 | Kusumi | |
| 4,415,803 A | 11/1983 | Muoi | |
| 4,417,292 A | 11/1983 | Borghese et al. | |
| 4,578,576 A | 3/1986 | Wheeler et al. | |
| 4,631,737 A | 12/1986 | Davis et al. | |
| 4,644,293 A | 2/1987 | Kennett | |
| 4,673,886 A | 6/1987 | Bickley et al. | |
| 4,683,443 A | 7/1987 | Young et al. | |
| 4,820,995 A * | 4/1989 | Tamura | 329/352 |
| 5,015,839 A | 5/1991 | Tanikoshi | |
| 5,136,257 A | 8/1992 | Reading | |
| 5,179,353 A * | 1/1993 | Miyake | 330/129 |
| 5,257,285 A | 10/1993 | Thorp | |
| 5,300,897 A | 4/1994 | Shiga et al. | |
| 5,423,078 A * | 6/1995 | Epperson et al. | 455/553.1 |
| 5,493,255 A * | 2/1996 | Murtojarvi | 330/296 |

(Continued)

OTHER PUBLICATIONS

Yamamoto et al. "A 3.2-V Operation Single-Chip Dual-Band AlGaAs/GaAs HBT MMIC Power Amplifier with Active Feedback Circuit Technique", IEEE Journal of Solid-State Circuits, vol. 35, No. 8, Aug. 2000, pp. 1109-1120.

*Primary Examiner*—Quan Tra
*Assistant Examiner*—An T. Luu
(74) *Attorney, Agent, or Firm*—Bever Hoffman & Hams, LLP

(57) ABSTRACT

A peak detector detects an amplifier output overvoltage condition if the amplifier drives a mismatched load impedance. In response to the detected overvoltage condition, a clamping transistor lowers a reference DC bias voltage supplied by a bias circuit to the amplifier. The lowered reference DC bias voltage lowers amplifier gain and output power, thus protecting the amplifier.

27 Claims, 2 Drawing Sheets

U.S. PATENT DOCUMENTS

| | | | |
|---|---|---|---|
| 5,884,153 A * | 3/1999 | Okada .................... 455/243.1 |
| 5,977,823 A | 11/1999 | Inoue et al. |
| 6,201,442 B1 | 3/2001 | James et al. |
| 6,208,209 B1 * | 3/2001 | Ng ............................ 330/279 |
| 6,459,340 B1 * | 10/2002 | Apel et al. ................... 330/298 |
| 6,580,321 B1 * | 6/2003 | Arell et al. .............. 330/207 P |
| 6,762,647 B1 * | 7/2004 | Apel .......................... 330/279 |
| 2003/0045251 A1 | 3/2003 | Arnott |

* cited by examiner

ACTIVE PROTECTION CIRCUIT FOR LOAD MISMATCHED POWER AMPLIFIER

CROSS-REFERENCE TO RELATED APPLICATION

This application is a continuation of U.S. patent application Ser. No. 10/215,802, which was filed on Aug. 9, 2002, now U.S. Pat. No. 6,762,647 and is incorporated herein by reference in its entirety.

BACKGROUND

1. Field of Invention

The invention is related to radio frequency (RF) power amplifier protection circuits.

2. Description of the Related Art

RF power amplifiers are intended to operate into a particular load impedance. This load impedance is typically set by an impedance matching circuit coupled to an antenna (load) used to radiate the amplified RF signal. In mobile transmitters (e.g., a cellular telephone handset), the proximity of the antenna to nearby objects (e.g., metal shopping carts) changes the load impedance.

In load mismatch situations, excess amplifier output power fails to reach the load and must be dissipated by one or more power amplifier transistors in the amplifier. In severe load mismatch conditions, this dissipated power damages or destroys the transistors. To preserve the transistors, the RF power amplifier must withstand load impedances that are mismatched to the load impedance for which the amplifier was designed. However, not all integrated circuit power transistors are capable of withstanding highly mismatched load impedances. Therefore, what is required is a device and a method to effectively protect the power transistors.

SUMMARY

A radio frequency (RF) amplifier driving a highly mismatched load impedance outputs an RF voltage that is over a predetermined level (overpeak voltage). A peak detector is used to detect the overpeak voltage. If an output overpeak voltage is detected, an emitter follower buffer is used to activate a clamping transistor. The clamping transistor is coupled to the output of a bias circuit, and the activated clamping transistor is used to limit a reference DC bias voltage output from the bias circuit. The reference DC voltage is applied to an RF amplifier—either the amplifier producing the RF output voltage being detected, or a previous amplifier in an amplifier chain that ends with the amplifier producing the RF output voltage being detected. The limited reference DC bias voltage limits the gain of the amplifier. Consequently, the output power of the amplifier producing the overpeak voltage being detected is reduced. Thus, the amplifier is protected when driving a highly mismatched load impedance.

In one embodiment a set of diodes is coupled in series between the output of the amplifier being protected and ground. The anode of a peak detector diode is coupled to a node between two diodes in the diode set. The number of semiconductor junctions between the amplifier output and the peak detector diode anode determines the detected voltage. The cathode of the peak detector diode is coupled to the base of an emitter follower buffer and to a capacitor shunting AC to ground. The emitter of the emitter follower is coupled to the base of a clamping transistor. The collector of the clamping transistor is coupled to the collector of a bias transistor. The activated clamping transistor limits the bias transistor collector voltage, which is used as the reference voltage output to the amplifier. In some embodiments the emitter of the emitter follower buffer is coupled to the base of two or more clamping transistors, each clamping transistor being associated with a unique bias circuit. Each unique bias circuit provides a clamped reference voltage to an amplifier in a chain of amplifiers.

DETAILED DESCRIPTION

Figure 1:
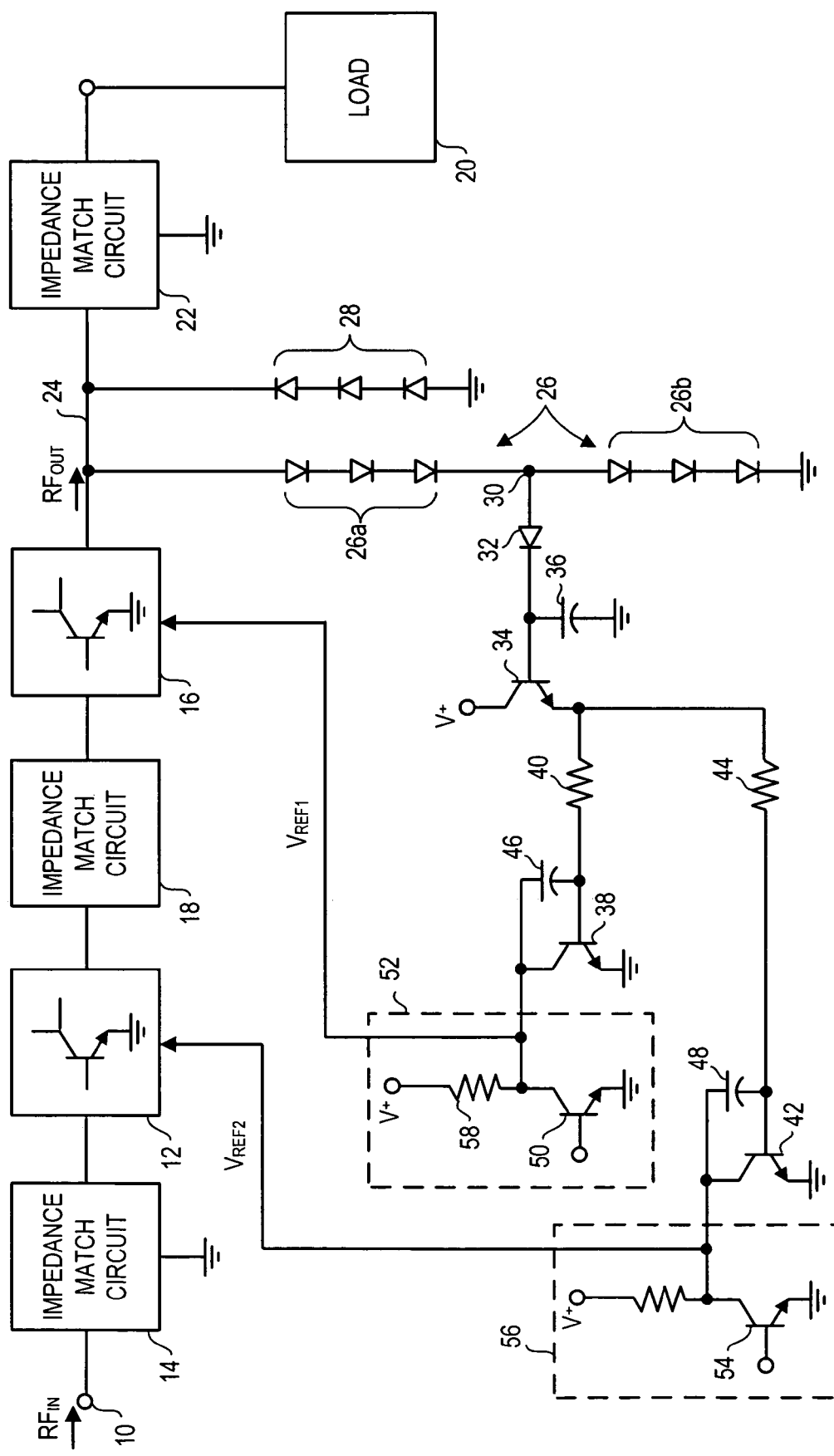
FIG. 1 is a combined diagrammatic and schematic view of an electronic circuit that includes an amplifier and a protection circuit for the amplifier.

Skilled individuals will understand that certain known circuit elements are omitted from the accompanying drawing so as to more clearly illustrate the embodiment. Skilled individuals will also understand that electrical components such as resistors, capacitors, and diodes are selected due to the electrical properties they possess, and that various actual devices may provide the desired electrical properties. For example, in some embodiments the diodes are diode-connected bipolar transistors. The V+ symbol in the drawings illustrates a supply voltage and is not necessarily the same value at each indicated point.

FIG. 1 is a combined diagrammatic and schematic view showing an embodiment of the invention. One embodiment is formed in a gallium arsenide (GaAs) integrated circuit. Other embodiments are formed in other semiconductor materials. As shown in FIG. 1, radio frequency (RF) input signal RFIN to be transmitted is received at input terminal 10 and is passed to RF driver amplifier 12 via input impedance matching circuit 14. Driver amplifier 12 subsequently outputs the RF signal to RF final power amplifier 16 via interstage impedance matching circuit 18. Power amplifier 16 then outputs signal RFOUT to load 20 (e.g., an antenna) via output impedance matching circuit 22. In one embodiment, all electrical circuit elements other than load 20 and impedance matching circuit 22 are formed as a single integrated circuit chip. In other embodiments, impedance matching circuit 22 may also be formed on the integrated circuit chip.

Impedance matching circuits 14, 18, and 22 are of conventional design and each include a network of at least one inductor and at least one capacitor. Transformers may be used in some embodiments of circuits 14, 18, and 22. Amplifier circuits 12 and 16 are depicted as including a transistor, which illustrates various known amplifier configurations. In the depicted embodiment, for example, the input signal to the amplifier is received at the base terminal of one or more transistors and the amplified signal is output at the collector terminal(s). In one instance, power amplifier 16 includes several gallium arsenide npn heterojunction bipolar transistors (HBTs) connected in parallel and outputting signal RFOUT from a node common to all collector terminals.

Two sets (a set may include one element) of series-connected diodes are connected between the output node 24 of amplifier 16 and ground (e.g., chassis ground). Diode set 26, which includes subsets 26a and 26b, is forward biased, and diode set 28 is normally reverse biased. These diode sets 26,28 provide electrostatic discharge protection and both positive and negative overvoltage protection.

Collector voltage of the power amplifier transistor(s) at output node 24 is sampled at node 30 between diode sets 26a and 26b, which act as a voltage divider. In one embodiment, the band gap voltage is approximately 1.3 volts. The number of diodes used in sets 26a and 26b depends on the amplifier 16 collector voltage at which clamping is desired. In one embodiment, diode set 26b includes three diodes (three junctions). The number of diodes in diode set 26a is then set by the desired limiting peak voltage, which in one instance is selected to be twice the magnitude of the DC supply voltage. That is, the total number of diodes in sets 26a and 26b, multiplied by 1.3 volts perjunction, is made equal to twice the magnitude of VCC applied to amplifier 16. Other numbers of diodes may be used.

The anode of peak-detector diode 32 is connected to node 30 and the cathode of diode 32 is connected to the base of emitter-follower buffer transistor 34. The cathode of diode 32 is also connected to ground via capacitor 36. Capacitor 36 is quickly charged to the peak detected level. The discharge time constant for capacitor 36 is designed to be long (relative to the modulation symbol rate in a digital modulated application) compared to normal envelope modulated periods to provide stable overvoltage protection loop operation.

The emitter output of transistor 34 is connected to the base of clamping transistor 38 via resistor 40 and to the base of clamping transistor 42 via resistor 44. The base and the collector of clamping transistor 38 are connected via capacitor 46. Similarly, the base and the collector of clamping transistor 42 are connected via capacitor 48. Capacitors 46 and 48 provide additional filtering in the protection loop response. The emitters of transistors 38 and 42 are connected to ground. The collector of transistor 38 is connected to the collector of bias transistor 50 in bias circuit 52. In the same way, the collector of transistor 42 is coupled to the collector of bias transistor 54 in bias circuit 56. DC bias reference voltage VREF1 is output from the collector terminals of transistors 38,50 to power amplifier 16 and is used therein as base bias voltage. Likewise, DC bias reference voltage VREF2 is output from the collector terminals of transistors 42,54 to amplifier 12 and is used therein as base bias voltage. The embodiment shown in FIG. 1 includes two amplifier stages. Hence, two bias circuit and clamping transistor combinations are used. In embodiments using other than two amplifier stages, a bias circuit and clamping transistor combination may be used for each one or more amplifier stage.

Referring to the circuits associated with amplifier 16 as an example, during normal operation in which amplifier 16 drives a reasonably matched load impedance, the voltage in signal RFOUT is insufficient to trigger the clamping operation of transistor 38. Without clamping transistor 38, voltage VREF1 is established by the current in resistor 58, which is the combined collector current in transistor 50 and current being drawn by a device in amplifier 16. As amplifier 16 begins to drive a load with a mismatched impedance, the voltage of signal RFOUT increases. At a predetermined voltage set by the number of diodes (i.e., semiconductor junctions) in diode sets 26a and 26b, the effect of this increased signal RFOUT voltage causes current to flow through diode set 26, peak detector 32, and emitter follower buffer transistor 34 to the base of clamping transistor 38. When clamping transistor 38 conducts, the resistor 58 current increases. The increased resistor 58 current causes an increased voltage across resistor 58, and consequently the value of voltage VREF1 is lowered. The lowered voltage VREF1 lowers the current in amplifier 16, which in turn lowers the voltage of signal RFOUT. The lowered amplifier 16 current corresponds to lowered amplifier 16 power output. Therefore, power dissipated by amplifier 16 due to the mismatched load is reduced and amplifier 16 remains undamaged. A similar action occurs in clamping transistor 42 and bias circuit 56 associated with amplifier 12, further reducing the power output by amplifier 16.

Figure 2:
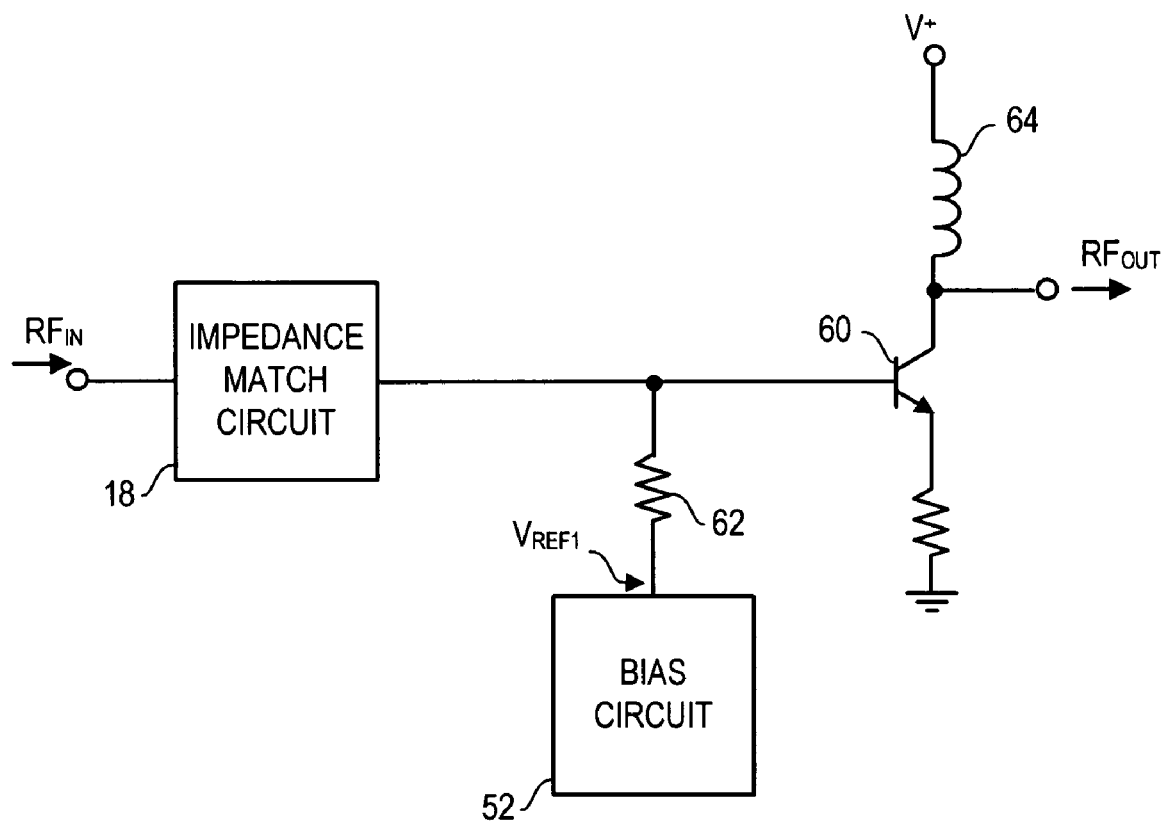
FIG. 2 is a combined diagrammatic and schematic view of an electronic amplifier.

FIG. 2 is a schematic view that shows electrical connections of an illustrative power amplifier transistor 60 in amplifier 16 which may include other similarly connected power amplifier transistors. In one embodiment, for example, transistor 60 is illustrative of one transistor cell of several GaAs HBT transistor cells having a common collector terminal. As shown in FIG. 2, the base of transistor 60 receives voltage VREF1 from bias circuit 52 via resistor 62 (e.g., a base ballast resistor). The base of transistor 60 also receives an RF signal for amplification from impedance match circuit 18. The emitter of transistor 60 is coupled to ground through a resistor. The collector of transistor 60 receives a DC supply voltage (e.g., VCC) via inductor 64 and outputs the amplified signal RFOUT. As voltage VREF1 is lowered, the base-emitter voltage of transistor 60 is lowered, and consequently the power output from transistor 60 is reduced. The circuit topology shown in FIG. 2 is also illustrative of amplifier 12 circuit topology.

TABLE I shows values of components in one embodiment. These values are illustrative and are not limiting.

TABLE I

| Component | Value | Component | Value |
| --- | --- | --- | --- |
| Resistor 40 | 500 Ohms | Capacitor 36 | 30 pF |
| Resistor 44 | 500 Ohms | Capacitor 46 | 5 pF |
| Transistor 34 | 45 $\mu m^2$ | Capacitor 48 | 5 pF |
| Transistor 38 | 45 $\mu m^2$ | | |
| Transistor 42 | 45 $\mu m^2$ | | |

The use of an integrated electrostatic discharge diode array to sense peak voltage in a protection loop to protect against over voltage conditions provides a structure and method that is simpler than more complicated circuits such as ones using directional couplers. Specific embodiments have been used to illustrate the invention, but skilled individuals will understand that various modifications and substitutions may be made. Therefore the invention is limited only by the following claims.

I claim:

1. A method of protecting an amplifier, comprising the acts of:
    providing an amplifier including an input terminal adapted to receive a RF signal, an output terminal adapted to output the RF signal after amplification therein, and at least one amplifier stage between the input and output terminals;
    providing a reference DC bias voltage to at least one said amplifier stage of the amplifier;
    detecting an overpeak voltage output of the amplifier, wherein said detecting comprises using a series of diodes coupled to the output terminal of the amplifier; and
    reducing the reference DC bias voltage in response to the detected overpeak voltage.

2. The method of claim 1, wherein detecting the overpeak voltage comprises using a peak detector diode coupled to a node of the series of diodes.

3. The method of claim 2, wherein reducing the reference DC bias voltage comprising using a clamping transistor that conducts in response to the detected overpeak voltage.

4. The method of claim 3, wherein using a clamping transistor comprises shunting current from an output terminal of a bias transistor outputting the reference DC bias voltage.

5. The method of claim 1, wherein the amplifier includes a plurality of the amplifier stages.

6. The method of claim 5, wherein the reference DC bias voltage is provided to a last of the plurality of amplifier stages.

7. The method of claim 5, wherein the reference DC bias voltage is provided at least to a said amplifier stage other than a last of the amplifier stages.

8. The method of claim 1, wherein there are a plurality of the amplifier stages, each of which is provided with a respective reference DC bias voltage, and the respective reference DC bias voltages provided to at least two of the amplifier stages are reduced in response to the detected overpeak voltage.

9. The method of claim 1, wherein reducing the reference DC bias voltage comprising using a clamping transistor that conducts in response to the detected overpeak voltage.

10. The method of claim 9, wherein the conduction by the clamping transistor shunts current from an output terminal of a bias transistor outputting the reference DC bias voltage.

11. A method of protecting an amplifier, comprising the acts of:
providing an amplifier including an input terminal adapted to receive a RF signal, an output terminal adapted to output the RF signal after amplification therein, and at least one amplifier stage between the input and output terminals;
providing a reference DC bias voltage to at least one said amplifier stage of the amplifier;
detecting an overpeak voltage output of the amplifier at the output terminal wherein detecting the overpeak voltage comprises using a plurality of diodes connected in series with the output terminal of the amplifier; and
reducing the reference DC bias voltage in response to the detected overpeak voltage using a clamping transistor that shunts current from an output terminal of a transistor of a bias circuit coupled to the at least one said amplifier stage.

12. The method of claim 11, wherein the amplifier includes a plurality of the amplifier stages.

13. The method of claim 12, wherein the reference DC bias voltage is provided to a last of the plurality of amplifier stages.

14. The method of claim 12, wherein the reference DC bias voltage is provided at least to a said amplifier stage other than a last of the amplifier stages.

15. The method of claim 11, wherein there are a plurality of the amplifier stages, each of which is provided with a respective reference DC bias voltage, and the respective reference DC bias voltages provided to at least two of the amplifier stages are reduced in response to the detected overpeak voltage.

16. An electronic circuit comprising:
an amplifier including an input terminal adapted to receive a RF signal, an output terminal adapted to output the RF signal after amplification therein, and at least one amplifier stage between the input and output terminals, the at least one amplifier stage receiving a reference DC bias voltage;
a first series of diodes coupled to the output terminal; a bias transistor comprising an output terminal from which reference DC bias voltage is output; and
a clamping transistor, wherein conduction by the clamping transistor depends on conduction by the first series of diodes, and conduction by the clamping transistor reduces the DC reference voltage output by the bias transistor.

17. The electronic circuit of claim 16, further comprising at least one diode coupled that has an output terminal coupled to the output terminal of the amplifier.

18. The electronic circuit of claim 16, further comprising an emitter follower in series with a node of the first series of diodes and with a control input of the clamping transistor.

19. The electronic circuit of claim 18, further a peak detector diode coupled between the node of the first series of diodes and a control input of the emitter follower.

20. The electronic circuit of claim 16, wherein the amplifier includes a plurality of the amplifier stages, and the reference DC bias voltage is provided to a last of the plurality of amplifier stages.

21. The electronic circuit of claim 16, wherein the amplifier includes a plurality of the amplifier stages, and the reference DC bias voltage is provided at least to a said amplifier stage other than a last of the amplifier stages.

22. The electronic circuit of claim 16, wherein there are a plurality of the amplifier stages, each of which is provided with a respective reference DC bias voltage, and the conduction by the clamping transistor reduces the respective reference DC bias voltages provided to at least two of the amplifier stages.

23. An electronic circuit comprising:
an amplifier including an input terminal adapted to receive a RF signal, an output terminal adapted to output the RF signal after amplification therein, and at least one amplifier stage between the input and output terminals, the at least one amplifier stage receiving a reference DC bias voltage;
a first series of diodes, wherein a first of the diodes has an input terminal coupled to the output terminal of the amplifier, the first series of diodes being operable to conduct in response to an overpeak voltage at the output terminal of the amplifier;
a second series of diodes, wherein a first of the diodes has an input terminal coupled to a ground and a last of the diodes has an output coupled to the output terminal of the amplifier; and
a control circuit coupled to a node of the first series of diodes, and operable to reduce the reference DC voltage in response to conduction by the first series of diodes.

24. The electronic circuit of claim 23, wherein the control circuit includes a clamping transistor that conducts in response to the conduction by the first series of diodes, the conduction of the clamping transistor causing the reduction in the reference DC voltage.

25. The electronic circuit of claim 24, wherein the conduction by the clamping transistor shunts current from an output terminal of a bias transistor that provides the reference DC voltage to the at least one said amplifier stage.

26. An electronic circuit comprising:
an amplifier including an input terminal adapted to receive a RE signal, an output terminal adapted to output the RF signal after amplification therein, and at least one amplifier stage between the input and output terminals, the at least one amplifier stage receiving a reference DC bias voltage;

a bias circuit providing the reference DC bias voltage to the at least one amplifier stage; and a clamping transistor, wherein conduction by the clamping transistor depends on whether a voltage of the RE signal at the output terminal exceeds an overpeak voltage, and the conduction by the clamping transistor reduces the DC reference voltage provided to the at least one amplifier stage.

27. The electronic circuit of claim 26, further comprising a first series of diodes, wherein a first of the diodes has an input terminal coupled to the output terminal of the amplifier, the first series of diodes being operable to conduct in response to the overpeak voltage, and the conduction by the clamping transistor depends on the conduction by the first series of diodes.

* * * * *